July 24, 1962 R. L. ANDERSON ET AL 3,046,459

MULTIPLE JUNCTION SEMICONDUCTOR DEVICE FABRICATION

Filed Dec. 30, 1959

INVENTORS
RICHARD L. ANDERSON
MARY J. O'ROURKE

BY Alvin J. Riddles
ATTORNEY

United States Patent Office 3,046,459
Patented July 24, 1962

3,046,459

MULTIPLE JUNCTION SEMICONDUCTOR DEVICE FABRICATION

Richard L. Anderson, Poughkeepsie, and Mary J. O'Rourke, Salt Point, N.Y., assignors to International Business Machines Corporation, New York, N.Y., a corporation of New York Filed Dec. 30, 1959, Ser. No. 862,887
7 Claims. (Cl. 317—235)

This invention relates to semiconductor device structures and in particular to device structures involving multiple junctions of the "Esaki" or "Tunnel" type.

The devices described herein employ as at least one of the p-n junctions in their structure, a p-n junction exhibiting a semiconductor phenomenon known as "quantum mechanical tunneling." This type of tunneling effect was first reported in an article in the Physical Review, January 1958 on pages 603 and 604, entitled "A New Phenomenon in Narrow p-n Junctions" by Leo Esaki. The article describes a semiconductor structure which has come to be known as the "Esaki" diode, and is sometimes alternatively referred to as the "Tunnel" diode. As described by Esaki, this diode when made using germanium semiconductor material, is a p-n junction structure in which the junction is very narrow, on the order of 150 angstrom units or less, and the semiconductor material on both sides of the junction have high impurity concentrations on the order of one impurity atom per 1,000 crystal atoms. The "Esaki" diode has two unusual characteristics; one is that the reverse impedance is very low, approaching that of a short circuit; and the second is that the forward potential current characteristic exhibits a negative resistance region. The negative resistance region is of the "n" type, that is, one in which an increase in current occurs initially, for a relatively small increase in potential, then, a substantial decrease in current with an incremental increase in potential followed by a region in which current then increases again with subsequent increases in potential. The turn-over points in the negative resistance characteristic, that is, the point at which the current begins to decrease with increases in potential and the point at which the current again begins to increase with increases in potential are very stable with respect to temperature in this device. These points do not vary appreciably over a range of temperatures varying from a value near 0° K. to several hundred degrees K. In addition, the "Esaki" diode device has been found to be relatively insensitive to radiation effects, presumably due to the high concentration of impurities in the semiconductor material.

The Esaki article identified germanium as a semiconductor material having the tunneling phenomenon and did not identify the impurities with which the phenomenon was observed. Further research has led to the belief that the phenomenon can be observed with any semiconductor material at some temperature level, providing suitable donor and acceptor impurity materials are available. The donor and acceptor impurity materials must be capable of being introduced into the crystalline semiconductor material in sufficient concentration to make the extrinsic material degenerate. For purposes of definition, a "p" type semiconductor may be said to be degenerate if the "Fermi" level is either within the valence band or if outside the valence band, it differs from the valence band edge of the energy gap by an energy not substantially greater than KT, where K is Boltsman's constant and T is the temperature in degrees Kelvin. Similarly, a degenerate "n" type semiconductor material is one in which the "Fermi" level is either within the conduction band or if outside the conduction band, it differs from the conduction band edge of the energy gap by an energy not substantially greater than KT.

In order that a semiconductor junction may exhibit the tunneling phenomenon, the "p" and "n" type materials must be such, adjacent to the junction, that the valence band of the "p" type material overlaps the conduction band of the "n" type material. It is also necessary that the junction between the "p" and "n" type materials, be very thin, on the order of 150 angstrom units, or less.

What has been discovered is that a multiple junction semiconductor structure may be fabricated, having alternate junctions which exhibit the tunneling phenomenon described by Esaki, and in which the output characteristics of the individual diodes making up the multiple junction structure add up to give a composite output characteristic that is unique in the art and one which exhibits improved photosensitivity, more rapid switching, has a lower ohmic impedance and exhibits a low resistance to both alternating and direct current.

An object of the present invention is to provide an improved multiple junction semiconductor device.

Another object of this invention is to provide an improved "Esaki" diode or "Tunnel" diode.

Still another object of this invention is to provide a control for the negative resistance output characteristic involving the "Esaki" or "Tunnel" phenomenon.

Another object of this invention is to provide an improved multiple junction photo-voltaic cell.

The foregoing and other objects, features and advantages of the invention will be apparent from the following more particular description of a preferred embodiment of the invention as illustrated in the accompanying drawings.

Figure 1:
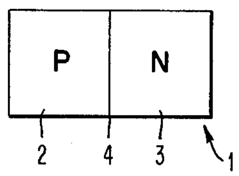
FIG. 1 is a schematic view of a semiconductor material having a p-n junction therein.

A semiconductor device structure exhibiting the quantum mechanical tunneling phenomenon described by Esaki involves a monocrystalline semiconductor material having a p-n junction therein separating two regions of extrinsic conductivity. Such a quantity of semiconductor material may be seen in connection with FIG. 1 wherein a single monocrystal of semiconductor material 1, is provided with a region of "p" type extrinsic conductivity 2, and a region of "n" type extrinsic conductivity 3, separated by a p-n junction 4. The p-n junction 4, in order to exhibit the "Esaki" or "Tunneling" effect, is very narrow, and is characterized by a very high concentration of conductivity type determining impurities on either side of the junction.

Where the semiconductor material 1 is of germanium, the number of crystal atoms is on the order of $4\times10^{22}$ per cc. and the requirement of sufficient conductivity type determining impurity to produce degeneracy in the semiconductor material is on the order of $10^{19}$ atoms per cc., or in other words, approximately one impurity atom per 1,000 crystal atoms. The heavy concentration of conductivity type determining impurities adjacent the junction, sufficient to produce degeneracy, also produces a very narrow junction width which in the case of germanium is in the order of 150 angstrom units or less.

Figure 2:
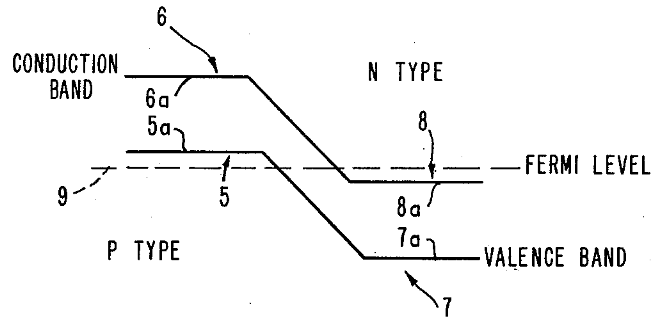
FIG. 2 is an energy level diagram illustrating the quantum mechanical tunneling phenomenon of Esaki across a junction such as in FIG. 1.

Referring next to FIG. 2, an energy level diagram is provided showing the conditions adjacent a p-n junction such as element 4 shown in FIG. 1, in order to produce the quantum mechanical tunneling or Esaki phenomenon. In FIG. 2, the "p" type material has a valence band 5 with an upper edge 5*a*, and a conduction band 6, with a lower edge 6*a*. The "n" type material similarly has a valence band 7, with an upper edge 7*a*, and a conduction band 8, with a lower edge 8*a*. The edges 5*a* to 6*a* and 7*a* to 8*a* define the energy gap in the material. The "Fermi" level is shown by the dotted line 9 and is within the valence band of the extrinsic conductivity type regions of the semiconductor materials. It is essential in order to secure the quantum mechanical tunneling effect of Esaki, that the conduction band of the "n" type material overlap or be within KT of the valence band of the "p" type material. The "Fermi" level must be within the valence or conduction band on one side of the junction, and at least close, within KT, of the valence or conduction band on the other side of the junction. The diode must be produced by a method which will leave the barrier junction very narrow, on the order of 150 angstrom units or less. When the semiconductor material is germanium, the concentration of impurity materials must be of the order of $10^{19}$ net donor or acceptor atoms per cubic centimeter in the extrinsic material. Suitable acceptor materials have been found to include gallium, aluminum, boron, and indium, and suitable donor materials have been found to include arsenic and phosphorus. Silicon, indium antimonide, gallium antimonide, and gallium arsenide have also been reported as suitable "Esaki" or "Tunnel" semiconductor materials. It is considered that any semiconductor material may be used to construct a junction having quantum mechanical tunneling characteristics at some temperature range, provided donor and acceptor materials are available which permit sufficiently high concentrations of impurity atoms. In general, semiconductors having a low or narrow energy gap will have lower capacitance than those produced from semiconductors having a wider gap, therefore the narrow gap semiconductors are more suitable to higher frequencies.

Figure 3:
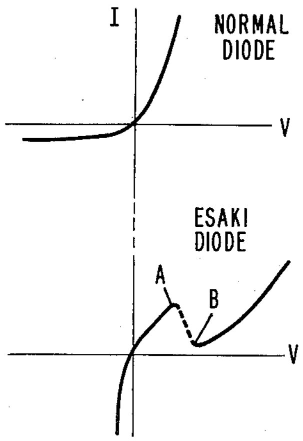
FIG. 3 is a potential current output characteristic showing a comparison of a normal diode and an Esaki diode.

Referring next to FIG. 3, the comparison between the output characteristic of a conventional diode and that of the quantum mechanical tunneling phenomenon of the "Esaki" diode is provided. In the upper curve potential versus current is plotted, wherein in the first quadrant, in the forward direction of the diode, a rapid increase in current with very little potential application is observed, in other words a low resistance is exhibited, and, in the third quadrant, or the back direction of the diode, a very little increase in current is demonstrated with substantial changes in potential, in other words a high resistance is exhibited. In comparison, in the "Esaki" diode, in the forward direction there is a steady increase in current to a turn-over point labelled A known in the art as the "peak" current after which there is a reduction in current flow with increased potential application to a second turn-over point labelled B known in the art as the "valley" current beyond which with further application of potential, there is a steady increase in current corresponding to the curve in the first quadrant of the normal diode in the forward direction. The "Esaki" diode, due to its extremely heavy impurity concentration has for all practical purposes no appreciable back resistance. This is shown in the third quadrant of the "Esaki" diode characteristic in FIG. 3 by the fact that for substantial increases in current the curve is almost parallel to the current axis with very small applications of potential.

Figure 4:
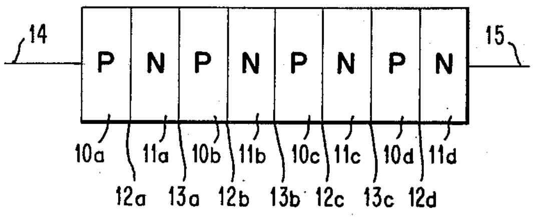
FIG. 4 is a multiple junction structure made in accordance with the teachings of this invention.

The structure of this invention comprises a multiple p-n junction semiconductor structure of alternate "p" and "n" conductivity type materials wherein alternate junctions are of the "Tunnel" or "Esaki" type. The structure of the invention may be seen in connection with FIG. 4, wherein for purposes of illustration, an eight zone semiconductor device is shown having a series of "p" conductivity type zones 10*a* through 10*d*, and a series of "n" conductivity type zones 11*a* through 11*d*. The junctions between zone 10*a* and 11*a*, 10*b* and 11*b*, 10*c* and 11*c*, and 10*d* and 11*d* are of the "Esaki" or Tunnel phenomenon type. These junctions have been labelled 12*a* through 12*d*. Alternate junctions within the device labelled junctions 13*a* through 13*c* are of the conventional junction type which, due to the extremely high impurity concentration, serve as effective ohmic contacts joining the regions forming "Esaki" type semiconductor junctions. The structure of FIG. 4 is provided with an ohmic external connection shown as a wire 14, to one external "p" region and another external ohmic contact 15 to the external "n" region at the opposite end of the series of junctions. While the number of "Esaki" diodes in series has been shown in this illustration to be four, it will be apparent from subsequent discussion, that as many such diodes as is convenient or desirable to form the composite potential-current characteristic curve desired may be provided. In the structure of FIG. 4 the potential-current output characteristic is similar to that of several diodes in series but the series resistance of the diode is comparable to a single such diode. In the case of current flow in one direction, the "Esaki" diode junctions 12*a* through 12*d* act as a short circuit connecting the other diodes because they are biased in the reverse direction while the conventional junctions are forward biased. Conversely, in the opposite direction of current flow when the conventional junctions are reverse biased, the "Esaki" junctions are forward biased and do not present a large impedance.

The device of FIG. 4 has considerable advantage as a photo-voltaic cell. In this type of device the "Esaki" junctions 12*a* to 12*d* can support no photo voltage, whereas the other junctions 13*a* through 13*c* are of the non-Esaki type so all photo voltages produced in the device have the same sign. Thus, a large photo voltage can be produced in a single device in this manner. The "Esaki" junctions are of low impedance and as a result, the series impedance can be very low in this device. The ohmic resistance is comparable to that of a single junction because only a thickness of semiconductor material necessary for mechanical stability need be used in all junctions.

Figure 5:
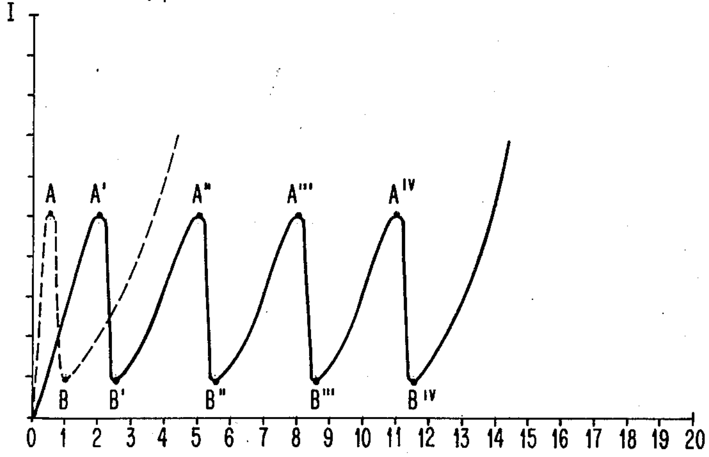
FIG. 5 is a combined output characteristic illustrating the performance of the device of this invention.

Referring next to FIG. 5, the potential current output characteristic of the device of FIG. 4 is shown. In FIG. 5, a conventional "Esaki" type characteristic described above in connection with FIG. 3 is shown dotted to provide a comparison with the solid curve indicative of the structure of FIG. 4. In the multiple stage diode of FIG. 4 a plurality of distinct peak currents labelled $A^{I}$, $A^{II}$, $A^{III}$, $A^{IV}$ are exhibited as each of "Esaki" type junctions 12*a* to 12*d* respectively switches to its low current state and similarly each peak current has its respective "valley" current $B^{I}$, $B^{II}$, $B^{III}$, and $B^{IV}$. In a structure such as that of FIG. 4, small variations in peak and valley current values for individual "Esaki" type diodes are imparted by impurity concentration control wherein a greater impurity concentration operates to increase the peak current.

In the "Esaki" type diodes of FIG. 4, the diodes 12*a* to 12*d* have approximately equal characteristics with small variations such that the diodes 12*a* to 12*d* with the highest peak currents have also the highest valley currents respectively, under these conditions then the diodes will have a composite diagram as shown in FIG. 5. When the above is not the case a more complicated composite curve with a greater number of peaks and valleys, will result.

It will be apparent to one skilled in the art that the curve of FIG. 5 illustrates a multi-stable device capable of many circuit applications, one example of which is analog to digital conversion wherein two current pulses $A^{I}$ and $A^{II}$ are received for a single five increment voltage impressed.

The multiple junctions semiconductor device of this invention may be fabricated employing the techniques of epitaxial vapor deposition. These techniques may be described in general to be the formation of a compound of the semiconductor material with a transport element which is generally a halogen, and then decomposing the transport element compound to deposit free semiconductor material on the monocrystalline substrate. The techniques of epitaxial vapor deposition have been developing in the art over a considerable period of time and are described in detail with respect to a sealed environment type deposition process in application Serial No. 816,572, filed May 28, 1959 and assigned to the assignee of this invention, and with respect to a dynamic environment type deposition process in application Serial No. 815,956, filed May 26, 1959, and assigned to the assignee of this invention.

In the fabrication of the structure of this invention using germanium material as is described in the above recited patent application employing a sealed environment, a source of germanium, a quantity of iodine and an impurity such as gallium in the form of gallium tri-iodide ($GaI_3$) are vaporized. During this time the temperature of the source germanium and a subtrate of germanium are held so that compounds formed are kept in a vapor state and so that negligible etching of the germanium subtrate and germanium source occurs. Once vaporization is completed, the temperature of the source germanium containing impurities of the conductivity type being deposited, is raised, causing germanium-iodides to be formed, the temperature of the substrate germanium seed crystal is then adjusted such that it is at the lowest temperature in the system and deposition occurs on the germanium substrate. The reaction may be represented for germanium by the following equation:

$$\underset{\text{(gas)}}{2GeI_2} \rightleftarrows \underset{\text{(solid)}}{2GeI_2} \rightleftarrows Ge + \underset{\text{(gas)}}{GeI_4}$$

The resistivity of the deposit is dependent upon the ratio of the impurity iodide to $GeI_2$ in the vapor. The germanium initially deposited will contain the heaviest impurity concentration. The resistivity of the deposit will decrease as the impurity compound becomes less in the vapor and is replaced by $GeI_2$. However, since a depletion region associated with the bias on an "Esaki" type junction moves only a very little in the crystalline structure as a result of the bias in a heavily doped region, for "Esaki" diode action, it is required only that the degeneracy of the semiconductor material be achieved in the immediate vicinity of the junction.

Under this technique, referring to the structure of FIG. 4, the "p" conductivity type region 10*a* would be placed in the sealed tube in the form of a germanium monocrystalline substrate. Upon the decomposition of germanium iodide vapor in the tube, germanium with a high "n" type impurity concentration would be epitaxially deposited on the substrate forming a junction later corresponding to the junction 12*a*. Upon completing a sufficient deposition for structural stability, thereby forming the "n" zone 11*a*, a conventional junction 13*a* is formed by changing the presence of the conductivity type determining impurity to "p" type in the vapor and depositing the "p" region 10*b*. The operation is continued, depositing regions containing a predominance of alternate "n" and "p" conductivity type determining impurities as the device of FIG. 4 is built up, and wherein heavy impurity concentrations are maintained in the crystal adjacent to every other junction and each heavy concentration is slightly heavier than the preceding one.

As an alternate process, the dynamic environment type vapor deposition process described in the above recited patent application may be employed. An impurity may be introduced into the dynamic system in the form of vaporized impurity-halogen compound. The resistivity of a deposit would then depend on the ratio of the impurity compound to germanium in the compound present. A high ratio would be necessary to insure sufficient concentration in the deposited ratio for degeneracy. A conductivity type change would be achieved by first flushing out the tube of the first impurity and then introducing the opposite type impurity. Again slightly heavier impurity concentrations would be employed in each subsequent diode in the composite structure.

What has been described is a semiconductor structure involving multiple junctions wherein every other junction is of the "Esaki" type so that a composite device having a unique output characteristic is provided. The device gives the benefit of a plurality of "Esaki" structures in series, but with the forward series resistance of only a single one and the output characteristic exhibited thereby yields multistable and analog to digital conversion circuit benefits useful in the art.

While the invention has been particularly shown and described with reference to a preferred embodiment thereof, it will be understood by those skilled in the art, that various changes in form and details may be made therein without departing from the spirit and scope of the invention.

What is claimed is:

1. A multiple junction semiconductor structure comprising at least six contiguous zones of monocrystalline semiconductor material of alternately opposite conductivity type joined at p-n junctions wherein the conductivity type determining impurity concentration in each zone immediately adjacent each even number junction is sufficiently high to produce degenerate semiconductor material on both sides of said each even numbered junction.

2. The semiconductor device of claim 1 wherein said semiconductor material is germanium, and wherein said impurity concentration in each zone adjacent each even numbered junction is in excess of $10^{19}$ atoms per cubic centimeter.

3. The multiple junction semiconductor device of claim 1 wherein each said even numbered p-n junction exhibiting quantum mechanical tunneling performance exhibits a greater peak current in order of number.

4. The multiple junction semiconductor device of claim 3 wherein said monocrystalline semiconductor is germanium.

5. A semiconductor structure comprising a monocrystalline semiconductor body including first, second, third, fourth, fifth, sixth, seventh, and eighth regions of alternately opposite conductivity type defining first, second, third, fourth, fifth, sixth, and seventh p-n junctions, said first, third, fifth, and seventh junctions being of the quantum mechanical tunneling type, said second, fourth, and sixth junctions being of the conventional type, and first and second external circuit means respectively connected to said first and said eighth regions.

6. The structure of claim 5 wherein said first, third, fifth, and seventh junctions respectively each exhibit a progressively higher peak current.

7. The structure of claim 6 wherein said monocrystalline semiconductor body is a germanium semiconductor body.

References Cited in the file of this patent

UNITED STATES PATENTS

| | | |
|---|---|---|
| 2,809,135 | Koury | Oct. 8, 1957 |
| 2,822,308 | Hall | Feb. 4, 1958 |
| 2,870,052 | Rittmann | Jan. 20, 1959 |
| 2,893,904 | Dickson | July 7, 1959 |
| 2,918,628 | Stuetzer | Dec. 22, 1959 |

OTHER REFERENCES

Physical Review, vol. 109 (1958), pages 603–4.